United States Patent [19]
Demirlioglu

[11] Patent Number: 5,994,718
[45] Date of Patent: Nov. 30, 1999

[54] TRENCH REFILL WITH SELECTIVE POLYCRYSTALLINE MATERIALS

[75] Inventor: Esin Kutlu Demirlioglu, Cupertino, Calif.

[73] Assignee: National Semiconductor Corporation, Santa Clara, Calif.

[21] Appl. No.: 08/910,811

[22] Filed: Aug. 13, 1997

Related U.S. Application Data

[63] Continuation of application No. 08/665,110, Jun. 14, 1996, abandoned, which is a continuation of application No. 08/443,953, May 18, 1995, abandoned, which is a division of application No. 08/228,487, Apr. 15, 1994, abandoned.

[51] Int. Cl.$^6$ .............................. H01L 29/04; H01L 29/00
[52] U.S. Cl. ............................................. 257/65; 257/520
[58] Field of Search .................................. 257/348, 520, 257/65, 774

[56] References Cited

U.S. PATENT DOCUMENTS

| | | | |
|---|---|---|---|
| 4,473,598 | 9/1984 | Ephrath et al. | 427/86 |
| 4,526,631 | 7/1985 | Silvestri et al. | 148/175 |
| 4,636,281 | 1/1987 | Buiguez et al. | 156/643 |
| 4,728,624 | 3/1988 | Silvestri et al. | 437/90 |
| 4,847,214 | 7/1989 | Robb et al. | 437/67 |
| 4,873,205 | 10/1989 | Critchlow et al. | 437/200 |
| 5,008,208 | 4/1991 | Liu et al. | 437/31 |
| 5,112,772 | 5/1992 | Wilson et al. | 437/67 |
| 5,212,110 | 5/1993 | Pfiester et al. | 437/67 |
| 5,213,989 | 5/1993 | Fitch et al. | 437/31 |
| 5,254,873 | 10/1993 | Poon et al. | 257/751 |
| 5,326,718 | 7/1994 | Klose et al. | 437/89 |
| 5,384,280 | 1/1995 | Aoki et al. | 437/67 |
| 5,387,537 | 2/1995 | Borel | 437/62 |
| 5,436,190 | 7/1995 | Yang et al. | 437/67 |

FOREIGN PATENT DOCUMENTS

| | | |
|---|---|---|
| 0059848 A3 | 9/1982 | European Pat. Off. . |
| 0187016 A3 | 7/1986 | European Pat. Off. . |
| 4112072 A1 | 10/1991 | Germany . |
| 62-276850 | 12/1987 | Japan . |
| 1-207945 | 8/1989 | Japan . |
| 2277406 | 10/1994 | United Kingdom . |

OTHER PUBLICATIONS

K.D. Beyer et al., "Trench Isolation By Selective EPI and CVD Oxide Cap," Journal Electrochem. Soc., vol. 137, No. 12, pp. 3951–3953, Dec. 1990.

W. J. Edwards et al., "Oxidation of Polycrystalline–SiGe Alloys," Techcon Dig., p. 550, 1993.

P. Krusius, "Shallow Trench Isoltion," NSC Presentation Notes, 21 pages, 1992.

H. Mikoshiba et al, "A New Trench Isolation Technology As a Replacement of Locos," IEDM, pp. 378–581, 1984.

M.C. Ozturk et al., "Rapid Thermal Chemical Vapor Deposition of Germanium and Germanium/Silicon Alloys On Silicon: New Applications In the Fabrication of MOS Transistors," Mat. Res. Soc. Symp. Proc. vol. 224, pp. 223–234, 1991.

R.D. Rung, "Trench Isolation Prospects For Application In CMOS VLSI," IDEM Digest, pp. 574–577, 1984.

V.J. Silvestri, "Selective Epitaxial Trench (Set)," Jul. 1988, Journal Electrochem. Soc.: Solid–State Science and Technology, vol. 135, pp. 1808–1812.

(List continued on next page.)

*Primary Examiner*—Teresa M. Arroyo
*Attorney, Agent, or Firm*—Skjerven, Morrill, MacPherson, Franklin & Friel LLP; Edward C. Kwok

[57] ABSTRACT

A trench refill for a semiconductor device is undertaken by depositing polycrystalline Ge or $Ge_xSi_{1-x}$ alloy at temperatures as low as 500° C. The structure is then oxidized at for example 700° C. to obtain a cap oxide on the trench refill. This method causes avoidance of (1) void formation, (2) facet formation, and (3) necessity of a second insulator deposition and planarization, meanwhile achieving all these advantages at a low thermal budget.

8 Claims, 6 Drawing Sheets

OTHER PUBLICATIONS

Hsia et al., "Polysilicon Oxidation Self–Aligned MOS (POSA MOS)–A New Self–Aligned Double Source/Drain Ion Implantation Technique For VLSI", IEEE Electron Device Letters, vol. EDL–3, No. 2, Feb. 1982, New York, USA, pp. 40–42.

Yoshikawa et al., "A Reliable Profiled Lightly Doped Drain (PLD) Cell For High–Density Submicrometer EPROM's and Flash EEPROM's", IEEE Transactions on Electron Devices, vol. 37, No. 2, Apr. 1990, New York, USA, pp. 999–1006.

TRENCH REFILL WITH SELECTIVE POLYCRYSTALLINE MATERIALS

This application is a continuation of application Ser. No. 08/665,110, filed Jun. 14, 1996, now abandoned, which is a continuation of application Ser. No. 08/443,953, filed May 18, 1995, now abandoned, which is a division of application Ser. No. 08/228,487, filed Apr. 15, 1994 now abandoned in favor of application Ser. No. 08/910,811, filed Aug. 13, 1997, pending.

FIELD OF THE INVENTION

This invention relates to semiconductor devices incorporating trench technology for use as device isolation, and in particular with the filling of trenches with selective polycrystalline alloys.

BACKGROUND OF THE INVENTION

As is well known, trench technology is used for isolation of semiconductor devices in an integrated circuit. Examples there of are shown in FIGS. 1A and 1B, indicating use of refilled trenches in CMOS and bipolar technologies.

Typically, common materials used for trench fill are CVD-deposited oxide, nitride, doped or undoped polysilicon or selectively-grown single crystal silicon.

FIG. 2 shows a sequence of steps in the prior art for providing such refilled trench structure, for example, for intra-well isolation of CMOS devices. Such a method is generally disclosed in "Shallow Trench Isolation", P. Krusius, NSC Presentation Notes, 21 pages (1992). For simplicity, only trenches in P well are described. For trenches in N well it will be understood that opposite polarity dopants are used, but that the same principles apply.

As shown in FIG. 2A, silicon substrate 20 has a P-well 22, with successive oxide 24, nitride 26 and oxide 28 (ONO) layers thereon, which are appropriately etched to provide an opening therethrough to the top surface of the substrate 20. A reactive ion etch (RIE) is undertaken to form the trench 30 (in CMOS technology generally less then 0.5 μm deep). An oxidation step is then undertaken to grow oxide 32 on the sidewalls and bottom of the trench 30, for example to the thickness of 70 to 100 nm (FIG. 2B). A further RIE is undertaken to remove the oxide from the bottom of the trench 30 (FIG. 2C). P+ doped polysilicon 34 is then deposited over the resulting structure, filling the trench 30, and subsequently a planarizing layer such as photoresist or SOG 36 is deposited (FIG. 2D). The SOG layer 36 and P+ doped polysilicon 34 are then etched back (FIG. 2E) to leave P+ doped polysilicon 34A in the trench, and a heating step is undertaken to grow cap oxidation 38 to the thickness of for example 100 to 200 nm, and also to form P+ diffusion layer 40 to suppress vertical parasitic conduction. Subsequently, the layers 28, 26 are removed by etching. Thereafter conventional CMOS process flow continues.

Another example of forming a trench in a CMOS device is shown in FIG. 3. Such a method is generally disclosed in "Trench Isolation Prospects for Application in CMOS VLSI", R. D. Rung, IEDM Digest, pp. 574–577 (1984). In this case, the steps of FIGS. 3A and 3B are identical to those of FIGS. 2A and 2B, but then the oxide layer on the bottom of the trench 130 is not removed (FIG. 3C). Subsequent thereto, the trench sidewalls and bottom are implanted with P type dopant to prevent parasitic field and sidewall transistor turn on. Then, for example, undoped polysilicon and/or CVD deposited oxide and/or nitride 150 are deposited in and over the trench 130.

Any common planarization technique, such as CMP, SOG layer 152 or resist deposition (FIG. 3D) and etch back can be undertaken, and conventional CMOS process flow continues (FIG. 3E).

A significant problem with these refill processes is that voids can form in the trench. In addition, the material in the trench may be structurally deficient. The presence of voids and loose structure have a tendency to magnify the formation of defects in active areas during subsequent processing.

With reference to FIG. 4, in bipolar devices, the isolation requires deeper trenches than those necessary in CMOS. For example, trench depths of 2 to 7 microns are typical for bipolar applications. Again, these trenches can be refilled using the techniques previously described in relation to FIGS. 2 and 3 (with or without removing the oxide at the bottom of the trench) and depositing insulating material and undertaking subsequent planarization steps. However, in such a situation, the disadvantages pointed out above of having voids and loosely packed material in the trench are magnified for bipolar applications due to the increased depth of the trench.

FIG. 4 shows a trench-refill technique using selective-epitaxial growth. In this regard, reference is made to U.S. Pat. No. 4,473,598, "Method of Filling Trenches With Silicon and Structures", L. M. Ephrath, V. J. Silvestri and D. D. Tang, issued Sep. 25, 1984; U.S. Pat. No. 4,526,631, "Method for Forming a Void Free Isolation Pattern Utilizing Etch and Refill Techniques", V. Silvestri and D. D. Tang, issued Jul. 2, 1985; "Selective Epitaxial Trench (SET)", V. J. Silvestri, Journal Electrochem. Soc. Vol. 135, pp. 1808–1812 (July 1988); "Trench Isolation by Selective Epi and CVD Oxide Cap", K. D. Beyer, V. J. Silverstri, J. S. Makris, and W. Guthrie, Journal Electrochem. Soc. Vol. 137, pp. 3951–3953 (December 1990); and "A New Trench Isolation Technology As A Replacement of Locos", H. Mikoshiba, T. Homma and K. Hamano, IEDM, pp. 578–581 (1984).

Initially, for example (FIG. 4A), a P− substrate 200 is provided, with N+ and N− layers 202, 204 thereon, and further with an oxide or nitride insulating layer 206 thereover. The insulating layer 206 has an opening therethrough through which the trench RIE is undertaken to form trench 208, down into the P− region 200. Subsequently (FIG. 4B), trench sidewall and bottom wall oxidation is undertaken to from oxide layer 210, and another dielectric layer 212 (for example nitride) is deposited over the resulting structure. An RIE of the bottom composite layer in the trench 208 is undertaken (FIG. 4C), exposing the substrate 200 in the trench 208. Suitable precleaning of the trench 208 is performed, and (FIG. 4D) silicon 214 of appropriate conductivity type is selectively grown in the trench 208, meanwhile forming the diffusion layer 216 for the suppression of parasitic conduction. The selective-growth process is terminated when epitaxial silicon reaches approximately two-thirds of the trench depth.

The process continues with the deposition of oxide, nitride or a combination of these materials 218. Any common planarization technique (FIG. 4E) such as CMP, SOG or resist deposition and etch back completes the trench-refill process.

Although this approach has been found to produce a void-free structure, sharp facets form near the sidewalls of the trench. This facet formation is a very strong function of the cleaning process used before selective epitaxial growth. Furthermore, the temperature of the selective growth process in this embodiment is between 850° C. and 1150° C., which adds considerably to the thermal budget of the process. Additionally, the requirement of filling the top portion of the trench with another insulator, in some cases with multiple layers, adds to the complexity of the process and does not offer any advantages in terms of defect density.

SUMMARY OF THE INVENTION

The problems described above are overcome by providing a trench refill by depositing polycrystalline Ge or $Ge_xSi_{1-x}$ alloy selectively at temperatures as low as 500° C. Instead of depositing other dielectrics and using planarization techniques, the structure is then oxidized at for example 700° C. to obtain a cap oxide on the trench refill. Such a method provides avoidance of 1) void formation, 2) facet formation, and 3) necessity of a second insulator deposition and planarization, meanwhile achieving all these advantages at a low thermal budget.

DESCRIPTION OF THE PREFERRED EMBODIMENTS

Reference is made to FIG. 5 for a description of a first embodiment of the invention.

It has been shown experimentally that polycrystalline Ge (germanium) or $Ge_xSi_{1-x}$ (germanium-silicon) alloy can be selectively deposited on silicon at temperatures as low as 500° C. See "Rapid Thermal Chemical Vapor Deposition of Germanium and Germanium/Silicon Alloys on Silicon: New Applications in the Fabrication of MOS Transistors", M. C. Ozturk, D. T. Grider, S. P. Ashburn, M. Sanganeria and J. J. Wortman, Mat. Res. Soc. Symp. Proc. Vol. 224, pp. 223–234 (1991), herein incorporated by reference. It has also been observed that the oxidation rates of these materials are higher at 700° C. compared to those obtained at higher temperatures. See "Oxidation of Polycrystalline-SiGe Alloys", W. J. Edwards, H. Tsutsu, D. G. Ast and T. I. Kamins, TECHCON Dig., p. 550 (1993), herein incorporated by reference. The proposed trench refill process for CMOS using these materials is shown in FIG. 5.

Figure 1A:
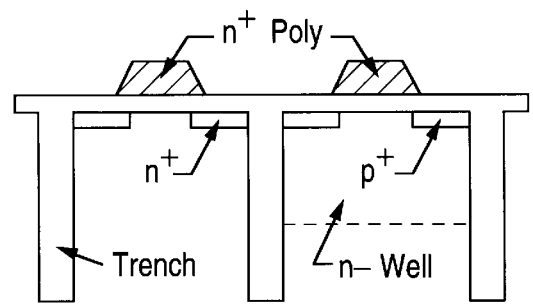
FIG. 1 includes FIGS. 1A–1B which illustrate typical CMOS and bipolar structures incorporating trenches.
Figure 1B:
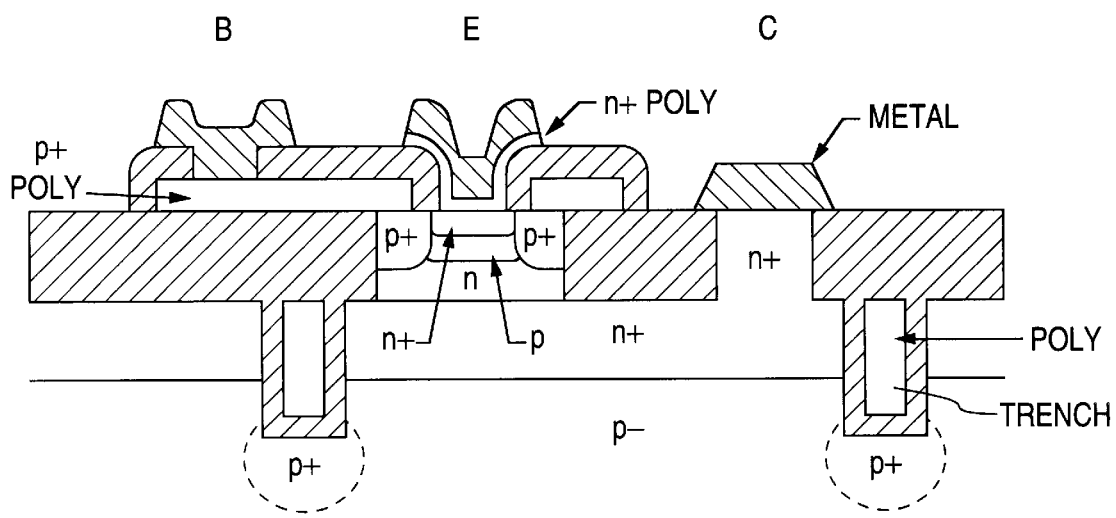
Figure 2A:
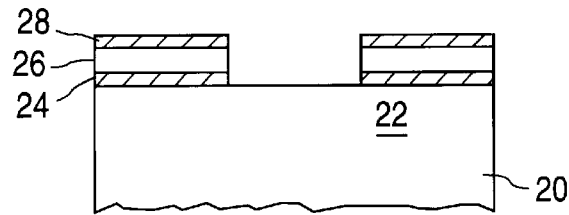
FIG. 2 includes FIGS. 2A–2E which illustrate a first typical prior art process flow for forming a refilled trench for intra-well isolation of CMOS devices.
Figure 2B:
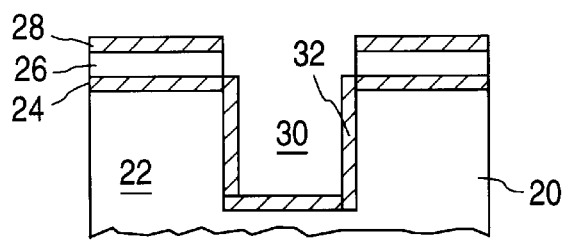
Figure 2C:
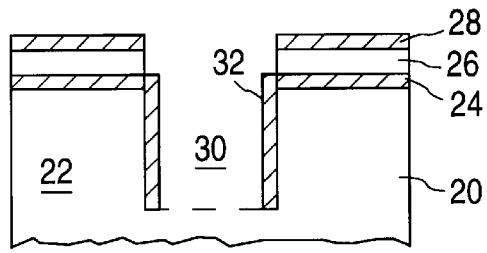
Figure 2D:
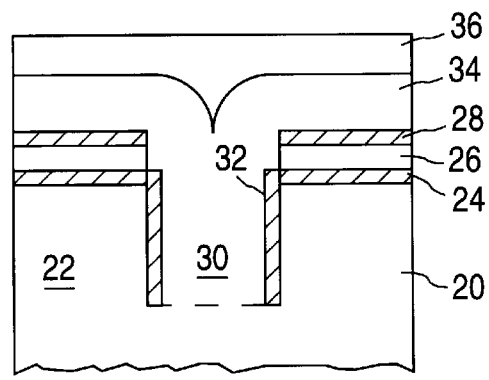
Figure 2E:
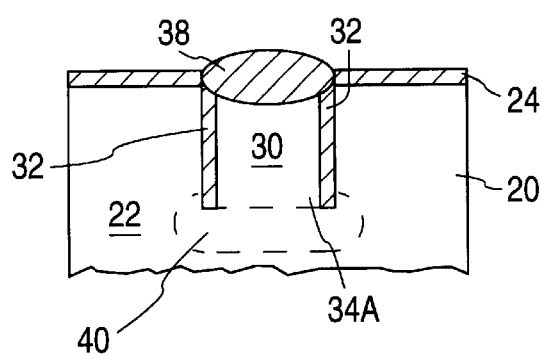
Figure 3A:
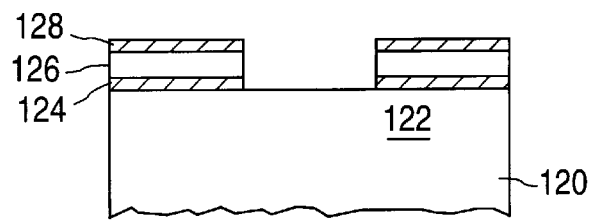
FIG. 3 includes FIGS. 3A–3E which illustrate a second typical prior art process flow for forming a refilled trench for intra-well isolation of CMOS devices.
Figure 3B:
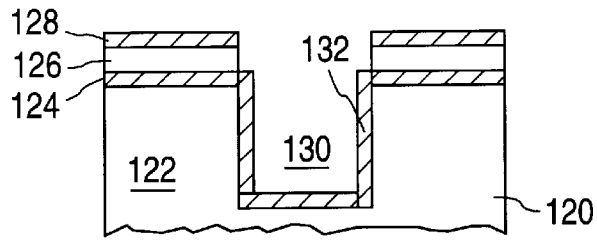
Figure 3C:
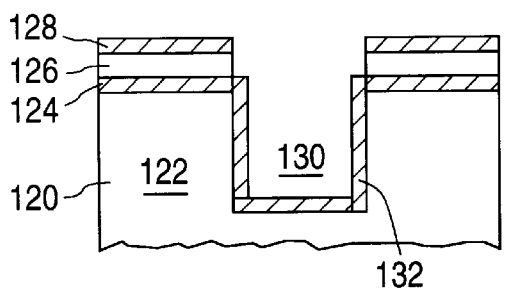
Figure 3D:
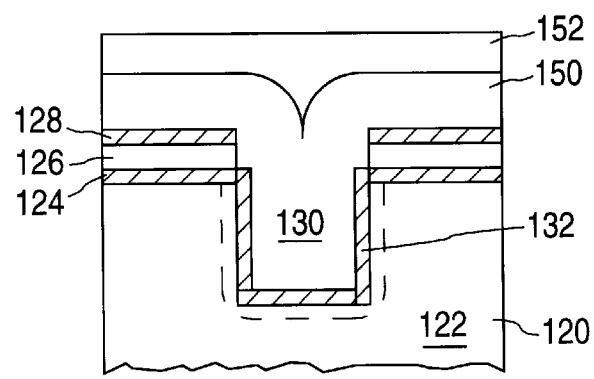
Figure 3E:
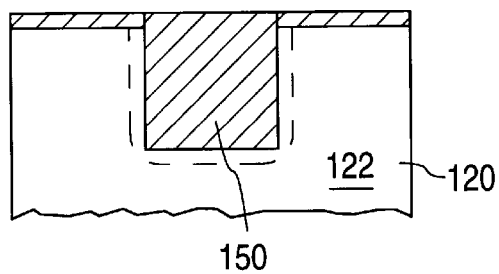
Figure 4A:
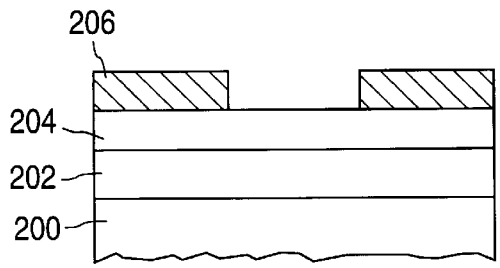
FIG. 4 includes FIGS. 4A–4E which illustrate a typical prior art process flow for forming a refilled trench for isolation of bipolar devices.
Figure 4B:
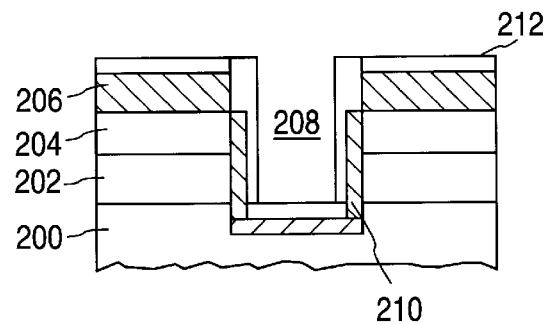
Figure 4C:
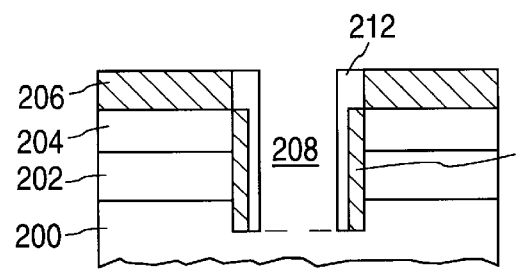
Figure 4D:
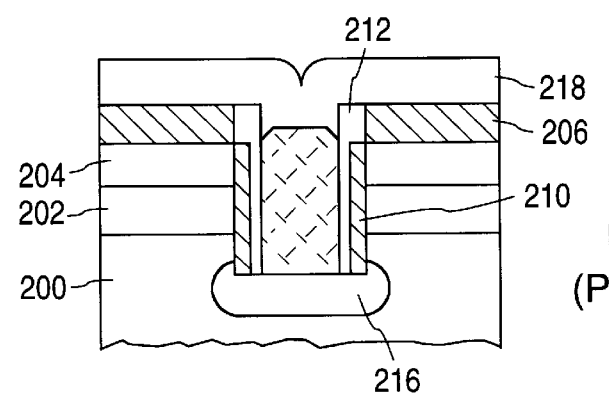
Figure 4E:
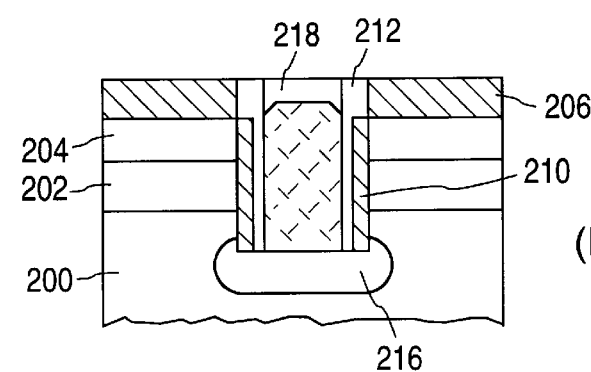
Figure 5A:
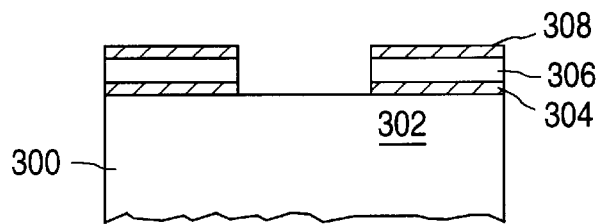
FIG. 5 includes FIGS. 5A–5E which illustrate a process flow for refilled trench for intra-well isolation of CMOS devices accordance with the present invention.
Figure 5B:
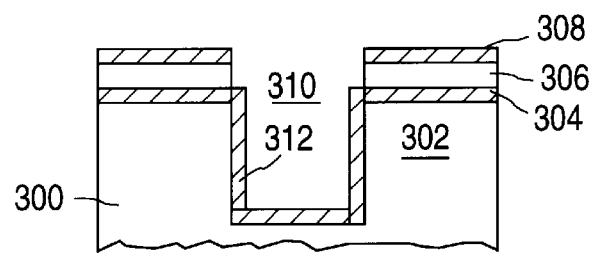
Figure 5C:
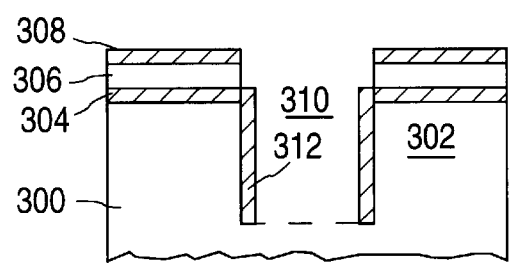
Figure 5D:
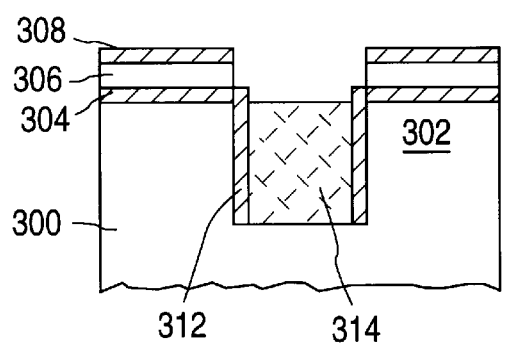
Figure 5E:
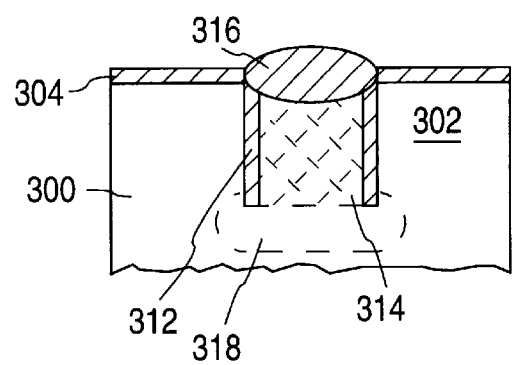
Figure 6A:
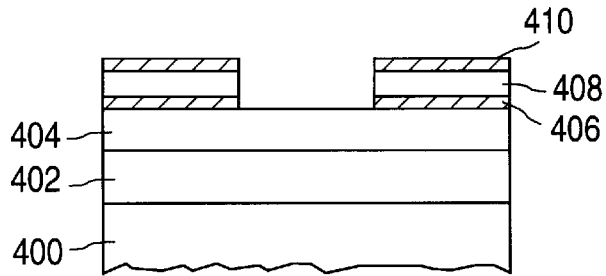
FIG. 6 includes FIGS. 6A–6E which illustrate a process flow for refilled trench for isolation of bipolar devices in accordance with the present invention.
Figure 6B:
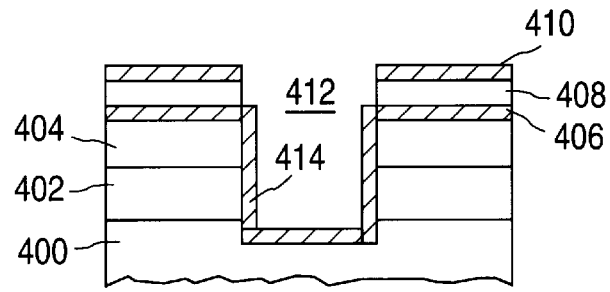
Figure 6C:
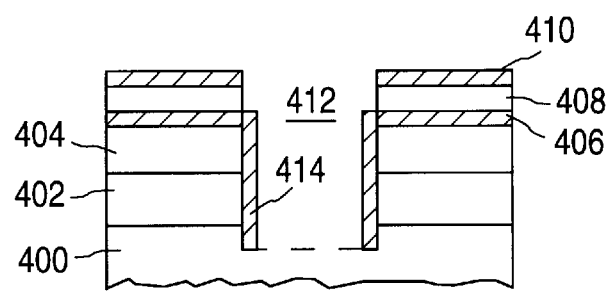
Figure 6D:
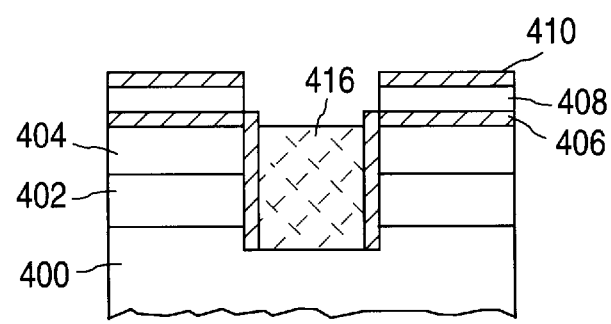
Figure 6E:
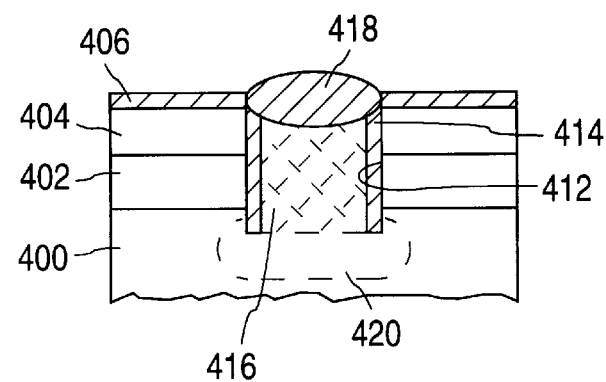

Initially in FIG. 5A, a silicon substrate 300 having a P well 302 is provided. A composite dielectric layer that suppresses the deposition of polycrystalline Ge or $Ge_xSi_{1-x}$ alloy and allows the local oxidation of these materials such as oxide 304/nitride 306 or oxide 304/nitride 306/oxide 308 is provided. A trench RIE (FIG. 5B) is undertaken to form trench 310. A dielectric material that suppresses the deposition of polycrystalline Ge or $Ge_xSi_{1-x}$ alloy such as oxide 312 is grown or deposited on the structure to a thickness of for example 30–100 nm depending on the width of the trench. An RIE is then undertaken to remove the dielectric from the bottom of the trench, exposing silicon (FIG. 5C). Polycrystalline Ge or $Ge_xSi_{1-x}$ alloy 314 with suitable dopant type and concentration are selectively deposited (FIG. 5D) in the trench 310 at a temperature of, for example 500° C. up to a desired level. Instead of depositing other dielectrics, the material 314 is then oxidized (FIG. 5E) at 700° C. to obtain a cap oxide 316 on the material. At the same time the diffusion layer 318 of appropriate polarity is formed (P+ in FIG. 5E). Subsequently, an etch is undertaken to remove the layers 398, 306, and further normal CMOS process steps are undertaken.

This method has numerous benefits, among them that void formation in the refill material 314 is avoided due to vertical growth of the refill material, and with the polycrystallinity of the material suppressing facet formation. Furthermore, the additional insulator deposition and planarization steps of the prior art are avoided. In addition, the process has a low thermal budget.

FIG. 6 shows the process of FIG. 5 as applied to a bipolar device. As soon therein (FIG. 6A), the P+ silicon substrate 400 is provided with N+ layer 402 and N– layer 404 thereon. ONO layers 406, 408, 410 are provided over the N– layer 404 and shaped as previously described. Further steps include RIE to form the trench 412 (FIG. 6B), and sidewall and bottom oxidation thereof to form oxide layer 414, removal of the bottom oxide by RIE (FIG. 6C), the selective polycrystalline Ge or $Si_x Ge_{1-x}$ alloy 416 deposition, (FIG. 6D) and cap oxidation 418 and formation of the diffusion layer 420 (FIG. 6E), followed by an etch to remove the oxide and nitride layers 410, 408.

In both the embodiments of FIGS. 5 and 6, the above advantages are realized, i.e., avoidance of (1) void formation, (2) facet formation, and (3) second insulator deposition and planarization, all achieved at a low thermal budget.

I claim:

1. A semiconductor structure comprising:
    a substrate having a trench therein;
    a suppressant dielectric on the sidewalls of the trench;
    a fill material overlying and in contact with said substrate, said fill material comprising selective polycrystalline alloy; and
    a thermally grown oxide of said polycrystalline alloy in said trench capping said fill material.

2. The structure of claim 1 wherein the fill material comprises germanium.

3. The structure of claim 2 wherein the fill material further comprises silicon.

4. The structure of claim 3 and further comprising an oxide on said fill material.

5. The structure of claim 3 wherein the fill material is polycrystalline.

6. The semiconductor structure of claim 1 wherein the selective fill material substantially fills said trench.

7. A semiconductor structure comprising:
    a substrate having a trench therein;
    a suppressant dielectric on the sidewalls of the trench;
    a selective fill material overlying and in contact with said substrate, said fill material comprising polycrystalline germanium; and
    a thermally grown oxide of said polycrystalline germanium in said trench capping said selective fill material.

8. The semiconductor structure of claim 7 wherein the selective fill material substantially fills said trench.

* * * * *